(12) United States Patent
Shimizu (10) Patent No.: US 6,433,337 B1
(45) Date of Patent: Aug. 13, 2002

(54) METHOD FOR DETECTING CARRIER PROFILE

(75) Inventor: Wataru Shimizu, Tokyo (JP)

(73) Assignee: Oki Electric Industry Co., Ltd., Tokyo (JP)

(*) Notice: Subject to any disclaimer, the term of this patent is extended or adjusted under 35 U.S.C. 154(b) by 0 days.

(21) Appl. No.: 09/472,814

(22) Filed: Dec. 28, 1999

(30) Foreign Application Priority Data

Jul. 13, 1999 (JP) .......................................... 11-198841

(51) Int. Cl.⁷ .......................... G01N 23/00; H01L 21/66
(52) U.S. Cl. ............................. 250/307; 438/14; 438/16
(58) Field of Search ................... 438/14, 16; 250/306, 250/307

(56) References Cited

U.S. PATENT DOCUMENTS 5,840,592 A * 11/1998 Russell et al. ....... 148/DIG. 93
6,153,444 A * 11/2000 Nakano et al. ............... 438/14
6,214,666 B1 * 4/2001 Mehta ......................... 438/257

* cited by examiner

Primary Examiner—Jack Berman
Assistant Examiner—Johnnie L Smith, II
(74) Attorney, Agent, or Firm—Rabin & Berdo, P.C.

(57) ABSTRACT

The object is to provide a method capable of detecting the carrier profile with ease and without any limitation. The method for detecting the carrier profile 100 includes a measurement step 110, the first analysis step 120, and the second analysis 130. In the measurement step 100, a p-n junction portion 150 (FIG. 2) to which a bias voltage is applied, is irradiated with laser beams P1 (FIG. 2) capable of moving the irradiation position thereof, thereby detecting the relation between the irradiation position and the OBIC generated in the p-n junction portion. In the first analysis step 120, there is detected, based on the relation as detected in the measurement step 110, the relation between the expanded width of a depletion layer generated in the p-n junction portion and the bias voltage. In the second analysis step 130, there is detected, based on the relation as detected in the first analysis step 120, a carrier profile in the p-n junction portion.

10 Claims, 6 Drawing Sheets

METHOD FOR DETECTING CARRIER PROFILE

BACKGROUND OF THE INVENTION

The present invention relates to a method for detecting the carrier profile of a semiconductor device including a p-n junction portion.

In development of a semiconductor device such as a large scale integrated circuit (referred to as "LSI" hereinafter), the most important thing to be done in the initial stage of the development is to accurately and sufficiently grasp or specify the characteristics of transistors in consideration of other elements and devices which are to be integrated together with transistors in a target LSI to be developed. If this is done neither sufficiently nor accurately, and if the characteristic of the transistor can not help being altered due to the change in the later manufacturing process, it would be not rare that there is required a large scale work for modification such as a complex and time consuming work for altering circuits and the others related thereto. Accordingly, the earliest modification of the carrier profile deciding the transistor characteristic has a very important meaning in the initial stage of the development and plays a significant role in shortening the turnaround-time of the development.

Therefore, in order to optimize the carrier profile in the impurity doped region of the transistor such as well, source and drain, lightly-doped-drain (LDD), channel stop depth and so forth, the condition of the method for forming the impurity doped region (for instance, the ion implantation method, the thermal diffusion method, etc.) is examined in general in the initial stage of the development of the device such as LSI. The transistor is then actually manufactured according to the examined and decided condition, and the characteristic of the transistor as manufactured is then examined.

In the examination of the transistor characteristic, it would be not rare to experience that the desk-planned or theoretical characteristic of the transistor differs from that of the actually manufactured transistor. If this happens, it is required to do the work for detecting the actual carrier profile and to compare it with that which is desk-planned, thereby confirming the degree of coincidence or matching between the actual carrier profile and the desk-planned one.

At present, two methods, for instance the secondary ion mass spectrometry (SIMS) and the pulse C-V method are well known and employed in general for detecting the carrier profile of a semiconductor device such as a transistor or like others.

(a) SIMS is a method basically making use of a sputtering phenomenon that occurs on the surface of a test element when irradiating it with primary ions. According to this method, the secondary ions generated in the sputtering phenomenon are analyzed by the mass spectrometer, thereby qualitatively and quantitatively determining the components of the test element. SIMS has the highest detection sensitivity among currently available method for surface analysis and enables an extremely small quantity of the subject matter to be accurately analyzed. Accordingly, SIMS is often used for measuring the impurity profile in the depth direction, for instance, being used for examining the distribution of impurities existing in the depth range of a few microns or so from the surface of the test element. SIMS is usually used for measuring the distribution of impurities existing in the depth range of 100 micrometer or less from the test element surface.

Despite the excellent and preferable performance of the SIMS, however, the scale of equipment for executing SIMS is apt to become larger and at the same time, the operator is required to have a high degree of proficiency in operation of the equipment. Therefore, SIMS might be not always the most preferable method for simply and easily evaluating the impurity or carrier profile of the semiconductor device.

(b) The pulse C-V method is a method in which the C-V characteristic of the oxide film or the p-n junction portion is measured, thereby electrically detecting the carrier profile under the oxide film or in the p-n junction portion. With the pulse C-V method, the carrier profile can be detected with relative ease. However, the pulse C-V method basically directed to the evaluation of the carrier profile at the test element group (TEG) level, so that it might be rather difficult to apply this method to the evaluation of the carrier profile at the device level.

The invention has been made in view of the above-mentioned difficulties and other problems, which were a subject of discussion in the prior art method for detecting the carrier profile. Thus, the object of the invention is to provide a novel and improved method for detecting the carrier profile which can be executed with ease under the less restriction.

SUMMARY OF THE INVENTION

In order to solve the above problems, according to the invention, there is provided a method for detecting the carrier profile of a semiconductor device including a p-n junction portion including: a first step of irradiating a p-n junction portion with light rays capable of moving the irradiation position thereof, thereby detecting the relation between the irradiation position and an electromotive force generated in said p-n junction portion being biased with a bias voltage; a second step of detecting the relation between the expanded width of a depletion layer taking place in the p-n junction portion and the bias voltage, based on the relation as detected in the first step; and a third step of detecting a carrier profile in the p-n junction portion, based on the relation as detected in the second step.

According to the method as constituted above, in the second step thereof, the position of the depletion layer edge portion is specified based on the relation detected in the first step, so that there can be detected the relation between the bias voltage and the expanded width of the depletion layer. This is because the magnitude of the optical electromotive force generated by irradiating the depletion layer with light rays differs in general from that which is generated by irradiating the region other than the depletion layer with light rays.

Furthermore, according to the method as constituted above, in the third step thereof, the carrier profile can be detected based on the relation detected in the second step. This is because the expanded width of the depletion layer in the p-n junction portion varies in general depending on the bias voltage and the carrier concentration (activated impurity concentration) in the depletion layer.

As described above, according to the method of the invention, the carrier profile can be detected by measuring the electromotive force generated in the p-n junction portion. To be more advantageous, this measurement can be executed with ease and at a device level.

Furthermore, the first step according to the method of the invention is constituted such that the light ray irradiation is carried out by employing two or more different irradiation angles, thereby detecting the relation between the irradiation position and the electromotive force generated in the p-n junction portion. A point in a space is defined in general as such a point that two straight lines pass therethrough intersecting each other thereat. Therefore, according to the method of the invention, the three-dimensional position of the depletion layer edge portion can be specified by irradiating the p-n junction portion with light rays incident thereon at two or more different irradiation angles.

Still further, the third step according to the method of the invention has such a constitution that the impurity concentration distribution is detected assuming that the p-n junction portion is formed as an abrupt junction. Still further, the third step has such a constitution that the impurity concentration distribution is detected assuming that in the p-n junction portion, the concentration of impurities with the first polarity is made sufficiently higher than that of impurities with the second polarity. Still further, the p-n junction portion is formed by means of the thermal diffusion method, in which impurities having a polarity opposite to that of a semiconductor wafer are doped into the principal surface of the wafer, and the light irradiation in the first step is executed with respect to the principal surface of the wafer.

BRIEF DESCRIPTION OF THE DRAWINGS

The above and other features of the invention and the concomitant advantages will be better understood and appreciated by persons skilled description given in conjunction with the accompanying drawings which illustrate preferred embodiments.

DETAILED DESCRIPTION OF THE PREFERRED EMBODIMENTS

The invention will now be described in detail by way of some preferred embodiments thereof with reference to the accompanying drawings. In the following descriptions as well as the accompanying drawings, constituents of the invention having the same function and structure are designated with the same reference numerals or characters, in order to avoid the redundant descriptions thereof.

First Embodiment

Figure 1:
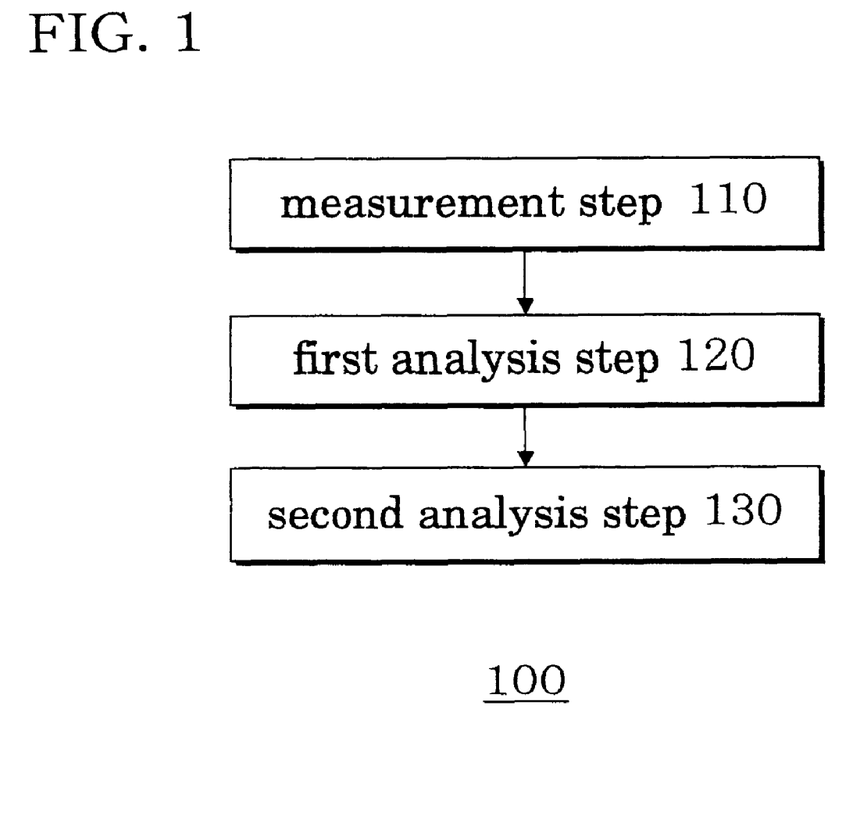
FIG. 1 is a flow chart showing the outline of a method for detecting carrier profile according to the invention.

The first embodiment of the invention will now be described with reference to FIG. 1 and FIGS. 2a through 2d. FIG. 1 is a flow chart showing an outline of a method for detecting carrier profile 100 embodying the invention while FIGS. 2a through 2d are diagrams for explaining the above method 100.

Figure 2A:
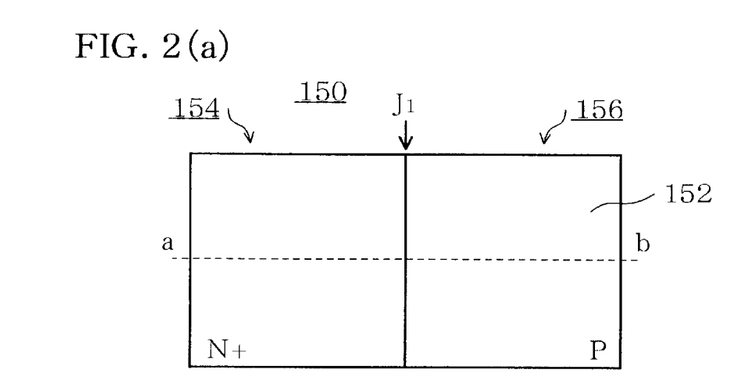
FIGS. 2a through 2d are diagrams for explaining the carrier profile detection method as shown in FIG. 1.

The carrier profile detection method 100 will be first described by way of an example of a p-n junction portion 150 as shown in FIG. 2a. As shown in this figure, the p-n junction portion 150 is divided by a junction position J1 as a boundary line into two regions, that is, an n-type region 154 and a p-type region 156. The p-n junction portion 150 has the carrier profile as shown in FIG. 2c.

The carrier profile detection method 100 according to the present embodiment is a one-dimensional carrier profile detection method which is executed in the horizontal direction with respect to the object observation surface of the test element. As shown in FIG. 1, in the carrier profile detection method 100, there are executed three processes which include a measurement step 110 as the first process, the first analysis step 120 as the second process, and the second analysis step 130 as the third process.

Figure 2B:
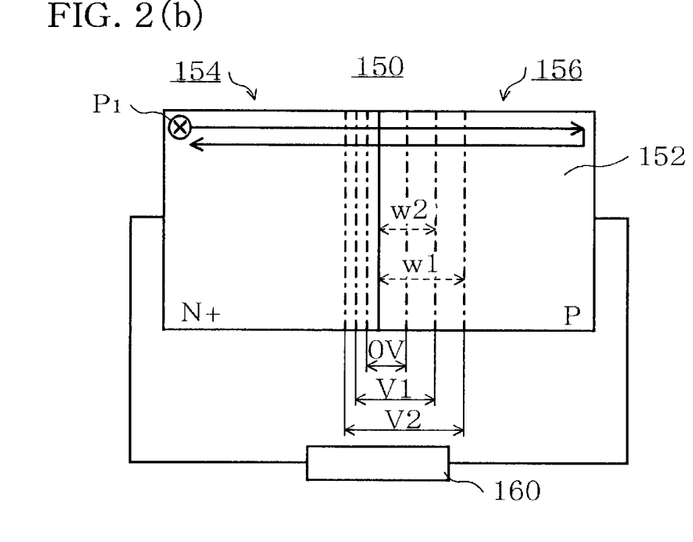
Figure 2C:
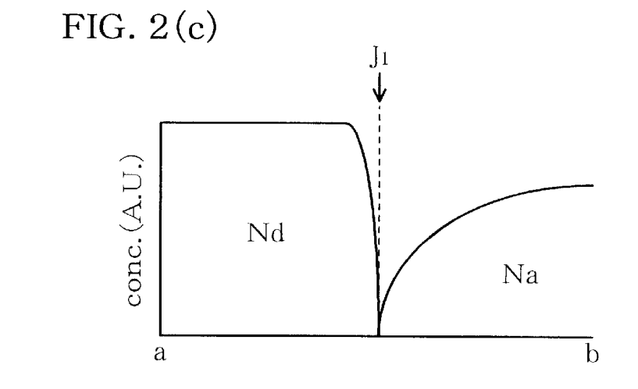

In the measurement step 110, as shown in FIG. 2b, there is detected by observing optical beam induced current (OBIC) the relation between the irradiation position of laser beam P1 and the OBIC generated in the p-n junction portion 150. The OBIC observation is a method for observing the internal state of the semiconductor, which is carried out by the steps of irradiating a semiconductor test element with the laser beam to generate electron-hole pairs therein; applying an internal electric field to those electron-hole pairs to; cause them to drift; detecting the drift current as the OBIC generated thereby, and observing the internal state of the test element based on the OBIC detection result.

In the measurement step 110, a bias voltage is applied to the test element including a p-n junction portion 150, thereby generating an internal electric field and a depletion layer in the p-n junction portion 150. Then, the p-n junction portion 150 is irradiated with the laser beam P1 incident on the principal surface of the test element i.e. the observation surface 152 at an almost right angle. The OBIC generated in the p-n junction portion 150 is amplified by an OBIC amplifier 160 and then detected. This OBIC detection is carried out over the entire observation surface 152 by scanning it with the laser beam P1, thereby being able to obtain the relation between the irradiation position of laser beam P1 and the OBIC generated in the p-n junction portion 150 with respect to the observation surface 152.

Furthermore, in the measurement step 110, after having detected the relation between the irradiation position of laser beam P1 and the OBIC generated in the p-n junction portion 150 with respect to one bias voltage applied to the p-n junction portion 150, a similar step may be carried out with respect to another bias voltage applied to the p-n junction portion 150, thereby being able to obtain another relation between the irradiation position of laser beam P1 and the OBIC generated in the p-n junction portion 150. That is, in the measurement step 110, various relations between the irradiation position of laser beam P1 and the OBIC are detected by varying in sequence the bias voltage applied to the p-n junction portion. Thus, in the measurement step 110, if the OBIC observation is carried out with respect to the identical test element by varying in sequence the bias voltage applied thereto, it becomes possible to detect the relation between the irradiation position of laser beam P1 and the OBIC in correspondence with each bias voltage.

In the first analysis step 120, the relation between the bias voltage and the expanded width of the depletion layer corresponding thereto is detected based on the relation between the irradiation position of laser beam P1 and the OBIC which is detected in the measurement step 110. The relation between the bias voltage and the expanded width of the depletion layer is detected in the first analysis step 120 as follows.

Even though the bias voltage is kept identical, the magnitude of the OBIC detected in the measurement step 110 differs depending on the region irradiated with the laser beam P1. That is, the OBIC obtained by irradiating the depletion layer of the p-n junction portion with the laser beam P1 is different from that which is obtained by irradiating the region other than the depletion layer with the laser beam P1. In the first analysis step 120, therefore, the position of the depletion layer edge on the side of the n-type region 154 and the position of the depletion layer edge on the side of the p-type region 156 are respectively specified based on the detection results obtained in the measurement step 110 with respect to each of applied bias voltages, and the distance between the two depletion layer edges is detected as the expanded width of the depletion layer with respect to each of the applied bias voltages. As a result, in the first analysis step 120, there is detected the relation between the bias voltage applied to the p-n junction portion 150 and the expanded width of the depletion layer corresponding thereto.

In the second analysis step 130, a carrier profile of the p-n junction portion 150 is detected by employing the relation between the bias voltage and the expanded width of the depletion layer, which has been detected in the first analysis step 120. With this second analysis step 130, the carrier profile of the p-n junction portion 150 can be detected, for instance, in the following manner.

If a bias voltage V is applied to the p-n junction portion 150, which is now assumed to be an abrupt junction, the expanded width W of the depletion layer formed in the p-n junction portion 150 can be obtained by the following equation (1).

$$W^2 = (2 \epsilon s/q) \times \{(Na+Nd)/NaNd\} \times (Vbi-V) \quad (1)$$

where ∈ s represents the dielectric constant (unit: F/cm) of the semiconductor forming the p-n junction portion, for instance $11.9 \times 8.854 \mathrm{e}^{-14}$ (F/cm) in case of the intrinsic silicon semiconductor; q an electric charge (unit: C) i.e. $1.602 \mathrm{e}^{-19}$ (C); Na an average acceptor impurity concentration (unit: $cm^{-3}$) of the depletion layer generated in the p-n junction portion when applying the bias voltage V thereto; Nd an average donor impurity concentration (unit: $cm^{-3}$) of the depletion layer generated in the p-n junction portion when applying the bias voltage V thereto; and Vbi (unit: V) a built-in potential of the p-n junction portion.

This built-in potential Vbi can be expressed by the following equation (2).

$$Vbi = (kT/q) \times \ln(Na0Nd0/ni2) \quad (2)$$

where k represents a Boltzmann constant(unit: J/K), about $1.381 \mathrm{e}^{-23}$(J/K); T an absolute temperature in the p-n junction portion 150 (unit: K); Na0 an average acceptor impurity concentration (unit: $cm^{-3}$) of the depletion layer generated in the p-n junction portion in the thermal equilibrium state; Nd0 an average donor impurity concentration (unit: $cm^{-3}$) of the depletion layer generated in the p-n junction portion in the thermal equilibrium state; and ni an intrinsic carrier concentration (unit: $cm^{-3}$), $1.45 \mathrm{e}^{10}$(unit: $cm^{-3}$) with respect to the intrinsic silicon at room temperature.

Accordingly, substituting the relation between the bias voltage and the expanded width of the depletion layer which is detected in the first analysis step 120, into the above equation (1) and rearranging terms, we can obtain the carrier profile of the p-n junction portion 150. Especially, if the impurity concentration of the n-type region 154 is sufficiently higher than the impurity concentration of the p-type region 156, the carrier profile of the p-n junction portion 150 can be simply obtained as follows.

If the impurity concentration of the n-type region 154 is sufficiently higher than the impurity concentration of the p-type region 156, that is, Nd >>Na, we can obtain the following expression (3) from the above equation (1).

$$W^2 \approx (2 \epsilon s/qNa) \times (Vbi-V) \quad (3)$$

Figure 2D:
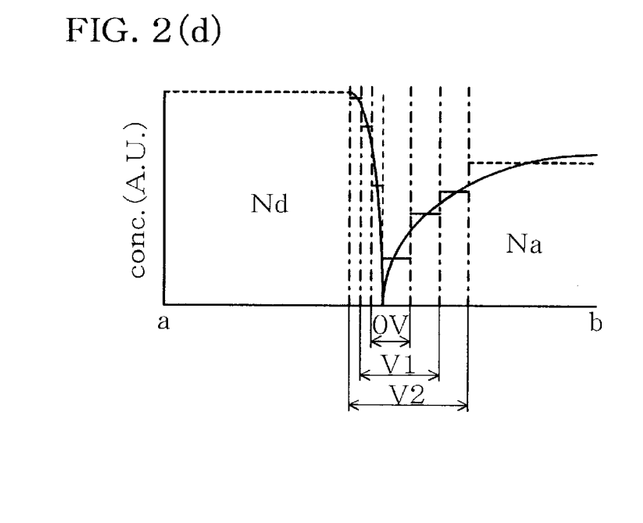

As shown in FIGS. 2b and 2d, in the relation between the bias voltage and the expanded width of the depletion layer detected by the first analysis step 120, it is now assumed that the change of the bias voltage V from V1 to V2 results in the change of the expanded width W of the depletion layer from W1 to W2. Substituting V1 and W1, and V2 and W2 into the above equation (3) and rearranging terms, we can obtain Na=Na1 corresponding to V=V1 and Na=Na2 corresponding to V=V2 as well. Furthermore, variation in the average acceptor impurity concentration (Na2−Na1) can be calculated from these calculated Na1 and Na2. Therefore, there can be further calculated the activated acceptor impurity concentration in the region between the position of the depletion layer edge at V=V1 and the position of the depletion layer edge at V=V2 by making use of the value (Na2−Na1).

Accordingly, in a similar manner, the activated acceptor impurity concentration can be sequentially obtained with respect to the region between the position of the depletion layer edge at one bias voltage and the position of the depletion layer edge at the other bias voltage, so that the carrier profile can be detected over the entire region of the p-n junction portion 150.

As has been discussed above, according to the first embodiment of the invention, the carrier profile of the test element in the direction in parallel with the observation surface can be obtained by making use of the bias voltage applied to the test element and the expanded width of the depletion layer detected by means of the OBIC method. The OBIC method can be executed with relatively simple operation of related equipment and can evaluate the expanded width of the depletion layer not only at a test element group (TEG) level but also at a device level. Accordingly, the first embodiment can provide a method for effective evaluation of the semiconductor device by which the carrier profile is obtained with a short turnaround-time (TAT).

Second Embodiment

Figure 3:
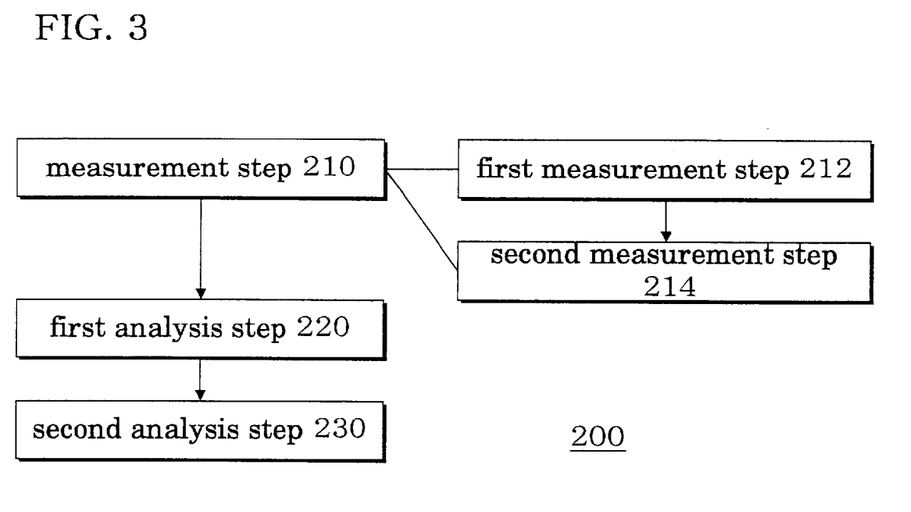
FIG. 3 is a flow chart showing an outline of another method for detecting carrier profile according to the invention.

Next, the second embodiment of the invention will be described with reference to FIGS. 4 and 6a through 6c. FIG. 3 is a flow chart showing an outline of a method for detecting carrier profile 200 according to the invention while FIGS. 4 and 6a through 6c are diagrams for explaining the carrier profile detection method 200.

Figure 4:
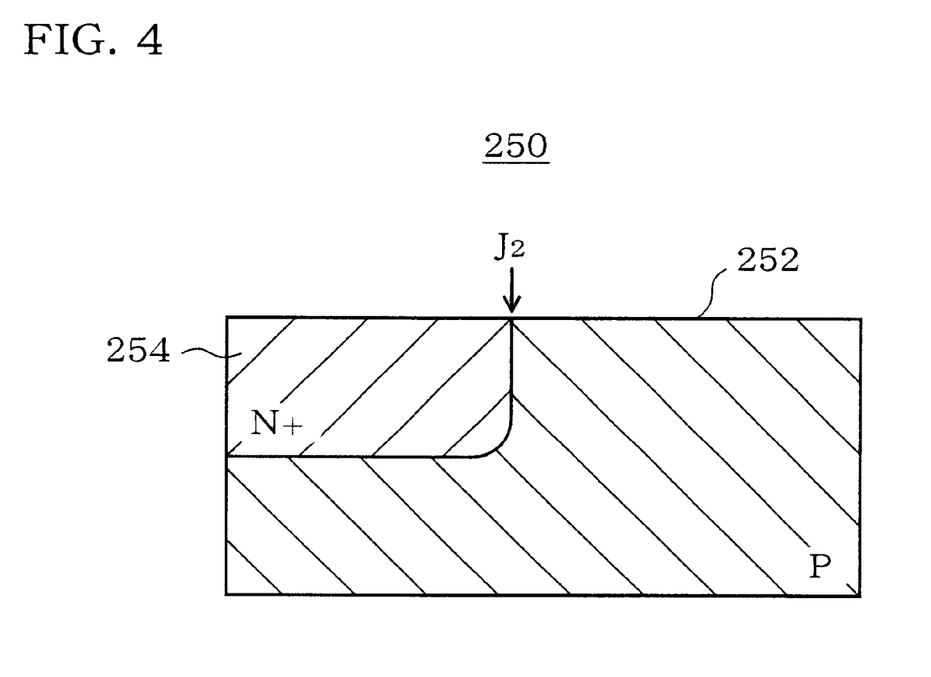
FIG. 4 is a sectional view showing a schematic structure of a test element to which the carrier profile detection method as shown in FIG. 3 is applicable.

The second embodiment will be described here by way of an example of a test element including a p-n junction portion 250, of which a cross-sectional view is shown in FIG. 4. As shown in this figure, the p-n junction portion 250 is divided by a junction position J2 as a boundary line into two regions, that is, an n-type region 254 and a p-type region 256. The p-n junction portion 250 is preferably formed by employing the thermal diffusion method such as the solid phase diffusion method, the vapor phase diffusion method and so on.

The carrier profile detection method 200 according to the present embodiment is a two-dimensional carrier profile detection method which is executed in both of horizontal and vertical directions with respect to the object observation surface of the test element. As shown in FIG. 3, in the carrier profile detection method 200, there are executed three processes which include a measurement step 210 as the first process, the first analysis step 220 as the second process, and the second analysis step 230 as the third process.

Figure 5:
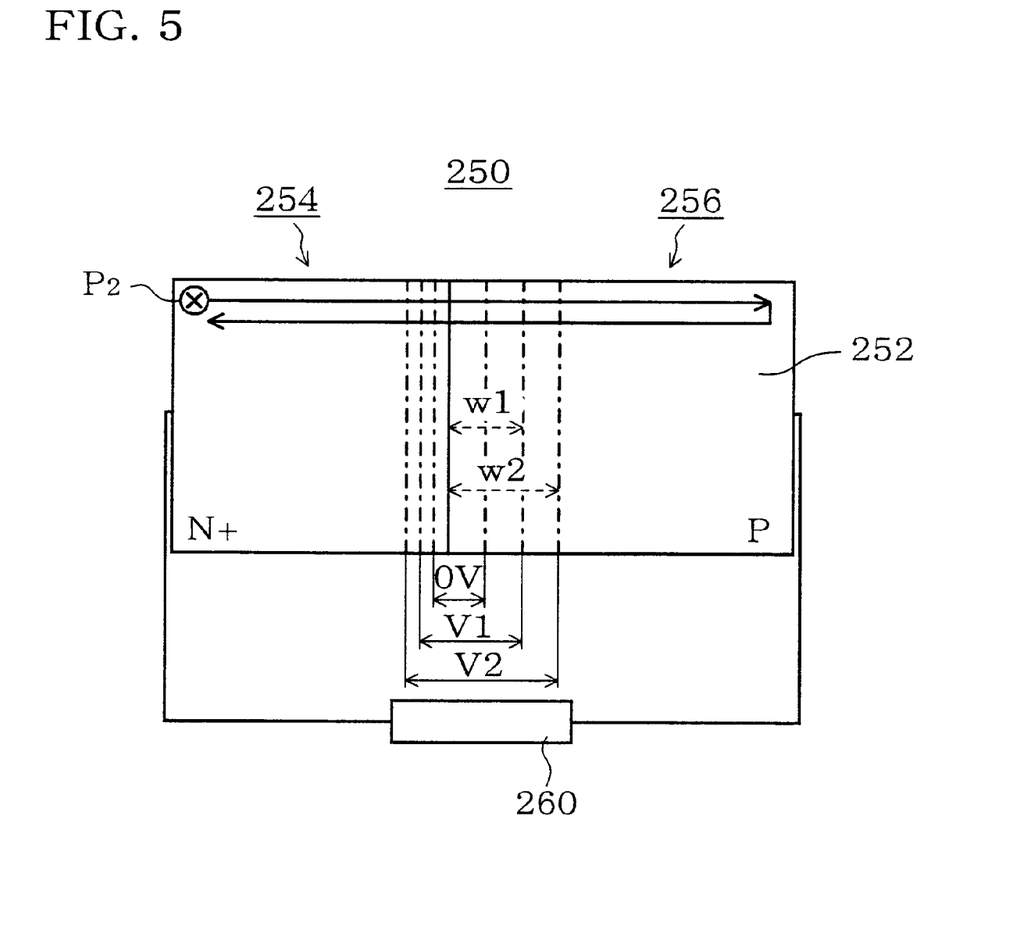
FIG. 5 is a diagram for explaining the carrier profile detection method as shown in FIG. 4.

In the measurement step 210, as shown in FIG. 5, the relation between the irradiation position of laser beam P2 and the OBIC generated in the p-n junction portion 250 is detected by carrying out the OBIC observation with respect to the p-n junction portion 250. In this second embodiment, the measurement step 210 further includes the first measurement step 212 and the second measurement step 214.

Figure 6A:
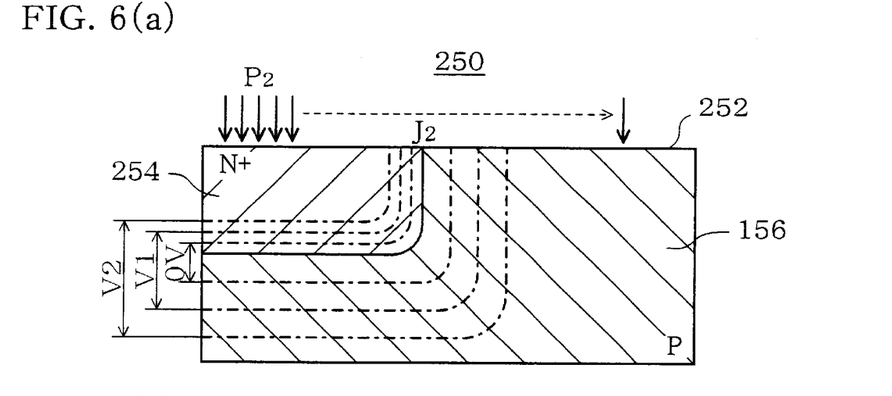
FIGS. 6a through 6c are diagrams for another explanation with respect to the carrier profile detection method as shown in FIG. 4.
Figure 6B:
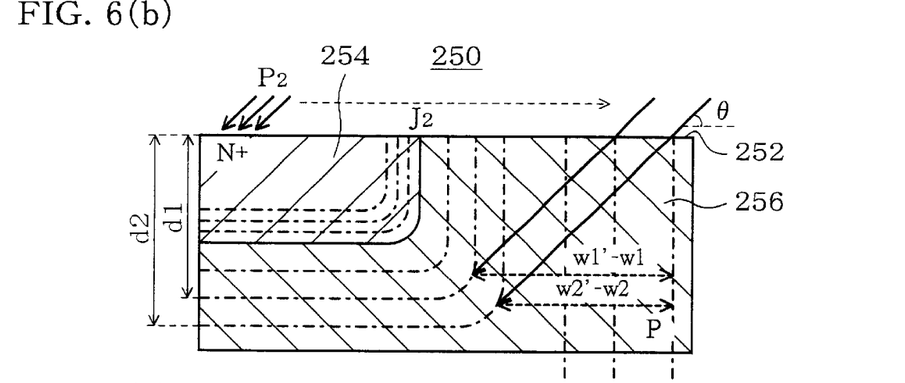

As shown in FIG. 6a, in the first measurement step 212, the OBIC observation of the p-n junction portion 250 is carried out, with respect to each of various bias voltages, by irradiating the p-n junction portion 250 with the laser beam P2 incident on the observation surface 252 of the test element at an almost right angle. As shown in FIG. 6b, in the second measurement step 214, similarly to the first measurement step 212, the OBIC observation of the p-n junction portion 250 is carried out, with respect to each of various bias voltages, by irradiating the p-n junction portion 250 with the laser beam P2 incident on the observation surface 252, making an angle Θ therewith.

The OBIC's respectively generated in the p-n junction portion 250 in the first and second measurement steps 212 and 214 are amplified and detected by an OBIC amplifier 260. As a result, in the measurement step 210, there can be obtained, with respect to each of various bias voltages, the relation between the irradiation position of laser beam P2 incident on the observation surface 252 at each of different irradiation angles and the OBIC generated in the p-n junction portion 250 with respect to each of those different irradiation angles.

In the first analysis step 220, the relation between the bias voltage and the expanded width of the depletion layer corresponding thereto is detected based on the relation between the irradiation position of laser beam P2 and the OBIC, which is detected in the measurement step 210. The first analysis step 220 is able to detect the relation between the bias voltage and the expanded width of the depletion layer basically in the same manner as the first analysis step 120 according to the first embodiment as shown in FIG. 1. However, the first analysis step 220 according to the second embodiment is different from the first analysis step 120 of the first embodiment in the following points.

That is, in the first analysis step 120 according to the first embodiment, the expanded width of the depletion layer is detected under the condition that irradiation of the p-n junction portion 150 with the laser beam is carried out at only one irradiation angle while the p-n junction portion 150 is biased with the identical bias voltage. In contrast with this, in the first analysis step 220 according to the second embodiment, the expanded width of the depletion layer is detected respectively with respect to different laser irradiation angles while the p-n junction portion 250 is biased with the identical bias voltage.

In the second analysis step 230, a carrier profile of the p-n junction portion 250 is detected by employing the relation between the bias voltage and the expanded width of the depletion layer, which has been detected in the first analysis step 220. The second analysis step 230 can detect the carrier profile in the p-n junction portion 250 in a direction in parallel with the observation surface 252 basically in the same manner as in the second analysis step 130 according to the first embodiment as shown in FIG. 1.

In addition, the second analysis step 230 according to the second embodiment can detect the carrier profile in the p-n junction portion 250 in the direction vertical to the observation surface 252 (referred to as "depth direction" hereinafter). In the following, it will be described how the second analysis step 230 can detect the carrier profile in the depth direction by way of an example of the p-n junction portion in which the impurity concentration in the n-type region 254 is made sufficiently higher than that in the p-type region 256.

The impurity concentration of the n-type region 254 being sufficiently higher than that of the p-type region 256, the width W of the depletion layer can be expressed by the following equation (4) which is rearranged from the above-mentioned equation (1).

$$W^2 \approx (2 \epsilon s/qNa) \times (Vbi-V) \quad (4)$$

Figure 6C:
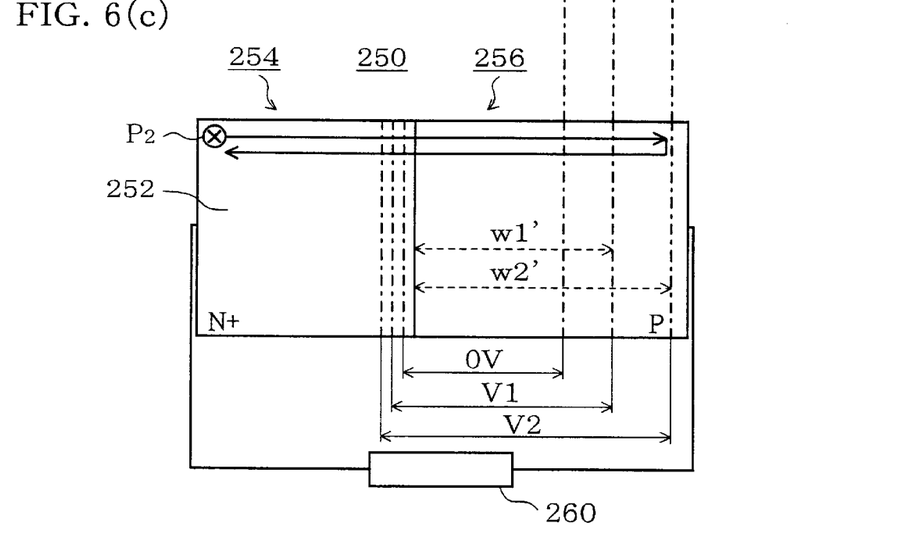

Referring to FIGS. 6a through 6c, it is assumed that in case of carrying out the OBIC observation in the direction vertical to the observation surface 252, the expanded width W of the depletion layer is W1 under the condition V=V1 while it is W2 under the condition V=V2. Also it is assumed that in case of carrying out the OBIC observation in the direction making an the angle of ψ with respect to the observation surface 252, the expanded width W of the depletion layer is W1' under the condition V=V1 while it is W2' under the condition V=V2.

Now, letting the expansion of the depletion layer in the depth direction be d1 and d2 under the conditions V=V1 and V2, respectively, they can be expressed by the following equations (5) and (6) in terms of W1, W2, W1' and W2'. That is:

$$d1 = (W1' - W1) \tan \psi \quad (5)$$

$$d2 = (W2' - W2) \tan \psi \quad (6)$$

Substituting the above equations (5),(6) and the condition of applied bias voltages V=V1, V2 into the above equation (4) and rearranging terms, we can obtain the following equations (7) and (8), which are:

$$d1^2 = (2 \epsilon s/qNa1) \times (Vbi-V1) \quad (7)$$

$$d2^2 = (2 \epsilon s/qNa2) \times (Vbi-V2) \quad (8)$$

Accordingly, Na1, Na2 and (Na1−Na2) can be obtained from these equations (7) and (8). In addition, the concentration of the activated acceptor impurity in the region between both of depths d1 and d2 can be approximated from the difference (Na2−Na1).

If the variation from Na1 to Na2 is so small, that is, Na1 is nearly equal to Na2, the activated acceptor impurity concentration Na in the region between depths d1 and d2 can be calculated by the following equation (9), which is:

$$Na = 2 \epsilon s(V1-V2)/\{q(d2^2-d1^2)\} \quad (9)$$

Accordingly, in a similar manner, calculating in sequence the concentration of the activated acceptor impurity with regard to the region between the depth of one depletion layer in one biased state and the depth of the other depletion layer in the other biased state, we can obtain the carrier profile over the entire region of the p-n junction portion 250.

According to the second embodiment of the invention as has been described in the above, the carrier profile not only in the lateral direction of the test element but also the carrier profile in the direction of the depth of the test element can be obtained base on the information obtainable by the OBIC method, the information including the expanded width of the depletion layer obtained by irradiating the observation surface of the test element with the laser beam incident thereon at an almost right angle thereto, the width (apparent width) of the expanded depletion layer obtained by irradiating the observation surface of the test element with the laser beam slantingly incident thereon at a certain angle to the vertical line thereof, and the bias voltage applied to the test element. The OBIC method can be carried out by the relatively simple operation of related equipment and can evaluate the expanded width of the depletion layer not only at a test element group (TEG) level but also at a device level. Accordingly, the second embodiment provides the effective evaluation of the semiconductor device, by which the carrier profile is obtained at a short turnaround time (TAT).

The invention has been discussed in detail by way of some examples preferably embodying the invention. However, the invention should not be limited by those examples. It will be understood that one who is skilled in the art may make variations and modifications within the category of the technical thoughts recited in the scope of claims for patent as per attached hereto, and that those variations and modifications naturally fall in the technical scope of the invention.

For instance, in the above-mentioned embodiments, the carrier profile is detected by irradiating the test element with light rays at two irradiation angles different from each other. However, the invention should not be limited by those embodiments. The invention is applicable to the method of detecting the carrier profile in which the test element is irradiated with light rays at three or more irradiation angles different from one another. In this way, the accuracy for specifying the three-dimensional position of the depletion layer edge can be enhanced by increasing the number of the irradiation angles.

According to the invention, one group of irradiation positions irradiated with light rays incident thereon at one irradiation angle and the other group of irradiation positions irradiated with light rays incident thereon at the other irradiation angle may be overlapped to each other in the range including irradiation positions through which each of irradiation light rays passes through the edge position of the depletion layer. Accordingly, the invention allows both of above irradiation position groups to have various relations therebetween, for instance both groups being substantially coincided with each other, one group containing the other, both groups being overlapped in part with each other, both groups being overlapped in the greater part with each other except just a part and so forth.

According to the invention, there is provided the method for detecting the carrier profile which can be carried out relatively with ease at the device level. Therefore, according to the invention, the matching or the degree of accordance between the carrier profile expected in the design stage and that which has been actually achieved can be quickly examined and confirmed in the initial stage of developing the semiconductor device.

The entire disclosure of Japanese Patent Application No. 11-198841 filed on Jul. 13, 1999 including specification, claims, drawings and summary is incorporated herein by reference in its entirety.

What is claimed is:

1. A method for detecting the carrier profile of a semiconductor device including a p-n junction portion comprising the steps of:

biasing the p-n junction portion;

irradiating a position of the p-n junction portion with light;

moving the position of irradiation of the p-n junction portion so as to generate an electromotive force in the p-n junction portion;

detecting a position/force relation between the irradiation position and the generated electromotive field;

detecting the voltage/width relation between the bias voltage and the expanded width of a depletion layer taking place in the p-n junction portion, based on the detected position/force relation; and detecting a carrier profile in the p-n junction portion, based on the detected voltage/width relation.

2. A method for detecting the carrier profile as claimed in claim 1, wherein when said irradiating is carried out at two or more different irradiation angles, the relation between the irradiation position and said electromotive force generated in the p-n junction portion is detected with respect to each of the two or more irradiation angles.

3. A method for detecting the carrier profile as claimed in claim 1, wherein in said step of detecting the voltage/width relation, there are specified the position of the depletion layer edge in the p-type region of the p-n junction portion and the position of the depletion layer edge in the n-type region of the p-n junction portion, the expanded width of the depletion layer thereby being detected as a distance between the depletion layer edge positions.

4. A method for detecting the carrier profile as claimed in claim 1, wherein in said third step, the carrier profile is detected based on an assumption that the p-n junction portion is an abrupt junction.

5. A method for detecting the carrier profile as claimed in claim 1, wherein in said third step, the carrier profile is detected based on an assumption that in the p-n junction portion, the concentration of impurities with the first polarity is made sufficiently higher than that of impurities with the second polarity.

6. A method for detecting the carrier profile as claimed in claim 1, wherein said step of detecting a carrier profile includes detecting a one-dimensional carrier profile in the p-n junction portion.

7. A method for detecting the carrier profile as claimed in claim 1, wherein said step of detecting a carrier profile includes detecting a two-dimensional carrier profile in the p-n junction portion.

8. A method for detecting the carrier profile as claimed in claim 1, wherein the optical electromotive force is an optical beam induced current (OBIC).

9. A method for detecting the carrier profile as claimed in claim 1, wherein the step of irradiating includes irradiating the position of the p-n junction portion with laser beams.

10. A method for detecting the carrier profile as claimed in claim 1, wherein the p-n junction portion is formed by employing the thermal diffusion method, in which impurities having a polarity opposite to that of a semiconductor wafer are doped to the principal surface of the wafer; and said step of irradiating is executed with respect to the principal surface of the wafer.

* * * * *